United States Patent
Lin et al.

(10) Patent No.: US 9,523,925 B2
(45) Date of Patent: Dec. 20, 2016

(54) SINGLE REFLECTIVE OPTICAL ELEMENT FOR INTERFERENCE LITHOGRAPHY

(71) Applicant: University of North Texas, Denton, TX (US)

(72) Inventors: Yuankun Lin, Lantana, TX (US); Jeffrey R. Lutkenhaus, Denton, TX (US); David George, Denton, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 261 days.

(21) Appl. No.: 14/449,360

(22) Filed: Aug. 1, 2014

(65) Prior Publication Data

US 2015/0043059 A1 Feb. 12, 2015

Related U.S. Application Data (60) Provisional application No. 61/863,343, filed on Aug. 7, 2013.

(51) Int. Cl.
 *G03F 7/20* (2006.01)
 *G02B 27/10* (2006.01)
(52) U.S. Cl.
 CPC ....... *G03F 7/70316* (2013.01); *G03F 7/70408* (2013.01); *G02B 27/10* (2013.01)
(58) Field of Classification Search
 None
 See application file for complete search history.

(56) References Cited

U.S. PATENT DOCUMENTS

| 2004/0129949 A1* | 7/2004 | Deliwala | B82Y 20/00 257/194 |
| 2012/0081687 A1* | 4/2012 | Burrow | G02B 27/10 355/71 |

OTHER PUBLICATIONS

S. Noda, M. Yokoyama, M. Imada, A. Chutinan, and M. Mochizuki, "Polarization mode control of two-dimensional photonic crystal laser by unit cell structure design," Science 293, 1123-1125 (2001).
K. P. Chen, B. McMillan, and L. Cashdollar, "Self-heated fiber Bragg grating sensors", Appl. Phys. Lett., 86, 143503 (2005).
Ye Liu, Fei Qin, Zi-Ming Meng, Fei Zhou, Qing-He Mao, and Zhi-Yuan Li, "All-optical logic gates based on two-dimensional low-refractive-index nonlinear photonic crystal slabs," Opt. Express 19, 1945-1953 (2011), http://www.opticsinfobase.org/oe/abstract.cfm?URI=oe-19/3/1945.

(Continued)

*Primary Examiner* — Stephone B Allen
*Assistant Examiner* — Ryan S Dunning
(74) *Attorney, Agent, or Firm* — Jackson Walker LLP (57) ABSTRACT

A single reflective optical element is constructed for use in interference lithography. The single reflective optical element is generally made up of at least two, and preferably four, polished reflective strips arranged to have particular angles relative to a laser beam passing through the optical element. A laser beam passing through the optical element will be partially reflected by the reflective strips to generate additional linearly polarized beams. The additional reflected beams overlap with the central laser beam and form an interference pattern as the beams pass out of the optical element. The generated polarized beams and interference pattern can be directed onto a photosensitive material to produce photonic crystals or photonic crystal templates.

23 Claims, 7 Drawing Sheets

(56) References Cited

OTHER PUBLICATIONS

Aniwat Tandaechanurat, Satomi Ishida, Denis Guimard, Masahiro Nomura, Satoshi Iwamoto, and Yasuhiko Arakawa, "Lasing oscillation in a three-dimensional photonic crystal nanocavity with a complete bandgap," Nat. Photonics 5, 91-94 (2011).

K. M. Ho, C. T. Chan, C. M. Soukoulis, R. Biswas, and M. Sigalas, "Photonic band gaps in three dimensions: new layer-by-layer periodic structures," Solid State Commun. 89, 413-416 (1994).

A. Blanco, E. Chomski, S. Grabtchak, M. Ibisate, S. John, S. W. Leonard, C. Lopez, F. Meseguer, H. Miguez, J. P. Mondia, G. A. Ozin, O. Toader, A. Geoffrey, O. Toader, H. M. van Driel, "Large-scale synthesis of a silicon photonic crystal with a complete three-dimensional bandgap near 1.5 micrometres," Nature 405, 437-440 (2000).

M. Deubel, G. von Freymann, M. Wegener, S. Pereira, K. Busch, and C. M. Soukoulis, "Direct laser writing of three-dimensional photonic-crystal templates for telecommunications," Nat. Mater. 3, 444-447 (2004).

M. Campbell, D. N. Sharp, M. T. Harrison, R. G. Denning, and A. J. Turberfield, "Fabrication of photonic crystals for the visible spectrum by holographic lithography", Nature 404, 53-56 (2000).

S. Yang, M. Megens, J. Aizenberg, P. Wiltzius, P. M. Chaikin, and W. B. Russel, "Creating periodic three-dimensional structures by multibeam interference of visible laser," Chem. Mater. 14, 2831-2833 (2002).

Y. Lin, P. R. Herman, and K. Darmawikarta, "Design and holographic fabrication of tetragonal and cubic photonic crystals with phase mask: toward the mass-production of three-dimensional photonic crystals," Appl. Phys. Lett. 86, 071117 (2005).

Y. Lin, A. Harb, D. Rodriguez, K. Lozano, D. Xu, and K. P. Chen, "Fabrication of two-layer integrated phase mask for single-beam and single-exposure fabrication of three-dimensional photonic crystal," Opt. Express 16, 9165-9172 (2008), http://www.opticsexpress.org/abstract.cfm?URI=OPEX-16/12/9165.

D. Chanda, L. E. Abolghasemi, M. Hague, M. L. Ng, and P. R. Herman, "Multi-level diffractive optics for single laser exposure fabrication of telecom-band diamond-like 3-dimensional photonic crystals," Opt. Express 16, 15402-15414 (2008), http://www.opticsexpress.org/abstract.cfm?URI=OPEX-16-20-15402.

Kris Ohlinger, Hualiang Zhang, Yuankun Lin, Di Xu, and Kevin P. Chen, "A tunable three layer phase mask for single laser exposure 3D photonic crystal generations: bandgap simulation and holographic fabrication," Opt. Mater. Express 1, 1034-1039 (2011), http://www.opticsinfobase.org/ome/abstract.cfm?URI=ome-1-5-1034.

Y. K. Pang, J. C. Lee, C. T. Ho, and W. Y. Tam, "Realization of woodpile structure using optical interference holography," Opt. Express 14, 9113-9119 (2006), http://www.opticsinfobase.org/oe/abstract.cfm?URI=oe-14-20-9113.

D. Xu, K. P. Chen, A. Harb, D. Rodriguez, K. Lozano and Y. Lin, "Phase tunable holographic fabrication for three-dimensional photonic crystal templates by using a single optical element", Appl. Phys. Lett. 94, 231116 (2009).

S.-G. Park, M. Miyake, S.-M. Yang and P. V. Braun, "Cu2O Inverse Woodpile Photonic Crystals by Prism Holographic Lithography and Electrodeposition," Advanced Materials 23, 2749-2752 (2011).

T. Y. M. Chan, O. Toader, and S. John, "Photonic band-gap formation by optical-phase-mask lithography," Phys. Rev. E 73, 046610 (2006).

O. Toader, T. Y. M. Chan, and S. John, "Diamond photonic band gap synthesis by umbrella holographic lithography," Appl. Phys. Lett. 89, 101117 (2006).

\* cited by examiner

SINGLE REFLECTIVE OPTICAL ELEMENT FOR INTERFERENCE LITHOGRAPHY

RELATED APPLICATIONS

This application claims the benefit of U.S. Provisional Patent Application Ser. No. 61/863,343, entitled SINGLE REFLECTIVE OPTICAL ELEMENT FOR INTERFERENCE LITHOGRAPHY, filed on Aug. 7, 2013, the entire content of which is hereby incorporated by reference.

This invention was made with government support under Grant No. CMMI-1109971 awarded by the National Science Foundation. The government has certain rights in this invention.

BACKGROUND

This disclosure pertains to optical elements for use in interference lithography. In particular, this disclosure relates to a single reflective optical element that generates multiple beam interference where reflected beams are created by and are arranged symmetrically around a central incoming beam.

Photonic crystals (PhCs) are dielectric periodic materials with photonic bandgaps where the propagation of electromagnetic waves is forbidden. Studies of photonic crystals have been driven by their potential applications. One-dimensional PhCs such as fiber Bragg gratings can be fabricated easily for applications in fiber optical communications and fiber sensors. Two-dimensional PhCs can be used for an integrated laser on chip or all-optical circuit. Low threshold lasers in three-dimensional (3D) photonic crystals have been predicted and lasing oscillations have been observed in 3D PhC nanocavities with the highest quality factor yet achieved (~38,500) with quantum dots. However a large-scale fabrication of 3D PhCs with large photonic bandgaps has been a challenge over the past decade. Several methods have been used for fabricating 3D PhCs, such as e-beam lithography for layer-by-layer structures, self-assembly of colloidal PhCs, two-photon direct laser writing, and laser holographic lithography.

Holographic lithography methods can produce 3D PhC templates by recording multi-beam 3D interference patterns in a positive or negative photoresists. So far holographic lithography has been successful in fabricating large-volume PhC templates at sub-micro/nano-scales. It is an adaptive method because the structure and symmetry of 3D PhC templates can be controlled by the beam propagating directions, the number of the interfering beams, the beam intensities, their respective polarizations and their relative phases. Among various structures, diamond-like and related woodpile structures have been intensively studied because of their wide and robust photonic bandgaps. However, the optical alignment is very complicated if bulky mirrors, polarizers, and beam splitters are used in multiple-beam holographic lithography. Very recently, a single diffractive or deflective optical element has been used for the laser holographic fabrication of 3D PhC structures in order to reduce the complexity of the optical setup and improve the optical stability. A flat-top prism and multi-layer phase mask have been demonstrated to fabricate diamond-like PhC templates by introducing a phase difference among the diffracted beams. Using a flat-top prism, a woodpile PhC template has been fabricated by introducing a phase shift $\pi$ of a single side beam relative to others using a glass cover slip as a phase modulation. Other groups have demonstrated a realization of woodpile PhC templates by shifting two counter-propagating side beams by $\pi/2$ relative to the others using the prism. Although both methods have succeeded in the fabrication of a large scale 3D PhCs, the control of intensity ratios among the five beams was not considered. The flat-top prism has been used to overlap four linearly polarized side beams arranged symmetrically around a circularly polarized central beam. The polarization of each beam has been adjusted individually using wave plates mounted before the flat-top prism.

No known method has been developed for fabricating an integrated, single reflective optical element for interference lithography for the fabrication of PhCs. Such an optical element would eliminate the need to use bulk optics to control the laser polarization and to arrange the interfering laser beams, therefore greatly reducing the complexity of optical setups for interference lithography.

SUMMARY

The present disclosure relates generally to an integrated, single reflective optical element for interference lithography for the fabrication of PhCs and its method of fabrication.

The single optical element, which is preferably silicon based, is able to automatically generate desired laser beam polarizations and intensities for the holographic fabrication of woodpile-type photonic crystal templates. To construct the single reflective optical element, polished strips are arranged symmetrically in a cut-out support frame. The strips are preferably made of silicon. The strips are then tilted in a critical angle relative to the laser beam in four directions, respectively, with the reflective side of the strips facing the laser beam. Placing this optics element into an expanded and collimated laser beam allows the reflective surfaces of the strips to reflect the circularly polarized beam into linearly polarized beams. The reflected beams overlap with the central beam that passes through a cut-out of the frame of the optical element, and form an interference pattern. Interference lithography can be done by placing a photosensitive material into the overlapping multi-beam region. The use of the single reflective optical element can eliminate the need to use bulk optics to control the laser polarization and to arrange the interfering laser beams, therefore greatly reducing the complexity of optical setups for interference lithography.

In an exemplary embodiment of the single reflective optical element, a polydimethylsiloxane (PDMS) mold based reflective optical element is fabricated for the generation of five-beam interferences where four beams are arranged four-fold symmetrically around a central beam. Silicon chips in the inner surfaces of the mold are used to reflect the circularly or elliptically polarized beam into four side beams that are linearly polarized with electric fields normal to the incident plane, and reduce their laser intensities. Such single beam and single optical element setup can lead toward the control of both laser intensity ratio among the interfering beams and polarizations of each beam, generating woodpile-type patterns, and improving the contrast of 3D structures. Photonic crystal templates are holographically fabricated in a photosensitive polymer through such silicon-on-PDMS based single optical element and single beam based configuration.

DETAILED DESCRIPTION OF PREFERRED EMBODIMENTS

Generally, the present disclosure relates to a single reflective optical element for use in interference lithography, and its method of fabrication. The single reflective optical element is generally made up of four polished reflective strips arranged to have particular angles within a support.

Figure 1:
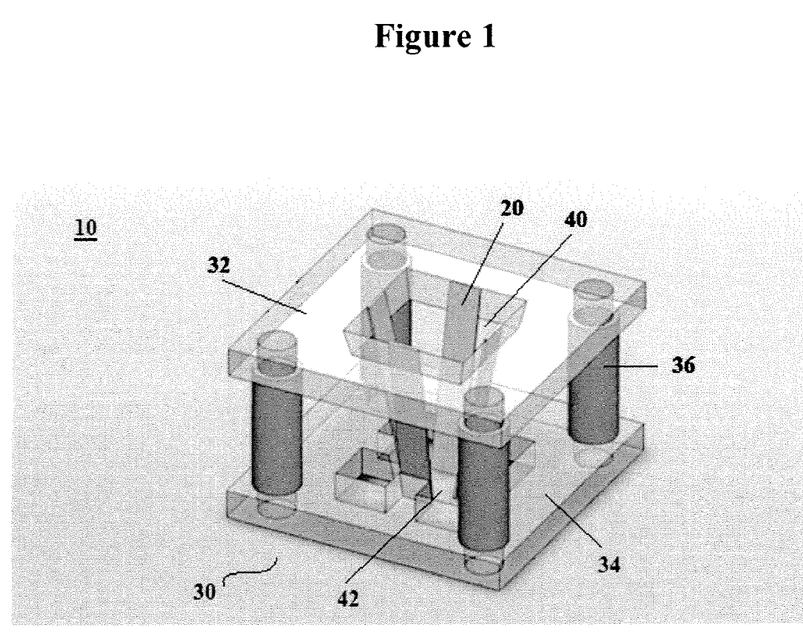
FIG. 1 shows a design for a preferred embodiment of a single reflective optical element.
Figure 2:
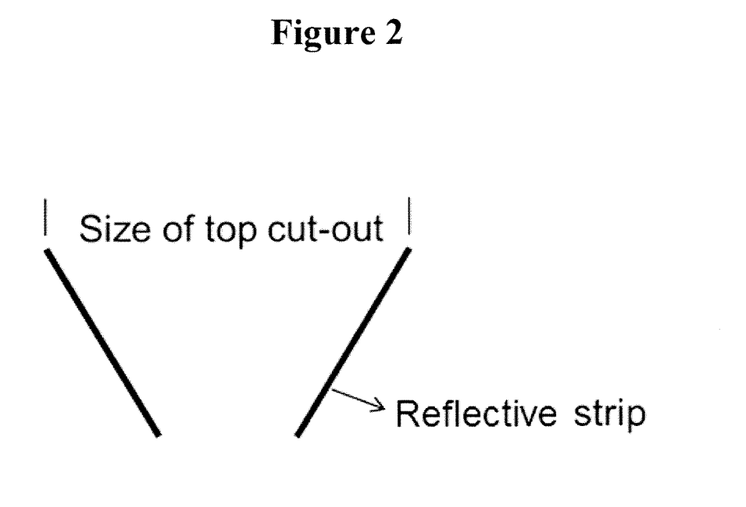
FIG. 2 shows a schematic illustrating the relationship between the top cut-out and the reflective strips of an example of the single reflective optical element.

FIG. 1 shows the preferred embodiment of a single reflective optical element 10. Four polished reflective strips 20 are arranged within a pre-arranged support 30. The support 30 is made up of a top piece 32, a bottom piece 34, and four solid support separators 36. The four solid support separators 36, which may be pillar shaped, separate the top piece 32 and the bottom piece 34. Within the top piece 32 of single reflective optical element 10 is atop cut-out 40. Within the bottom piece 34 of single reflective optical element 10 is a bottom cut-out 42. The top cut-out 40 and bottom cut-out 42 are generally square shaped and are different sizes. They are cut into the top piece 32 and bottom piece 34, respectively. The support 30 is preferably arranged so that the planes of the top piece 32 and bottom piece 34 are parallel to each other and with concentric positioning for the top cut-out 40 and bottom cut-out 42. The sides of the top cut-out 40 and bottom cut-out 42 may have rotational symmetry along an axis that is perpendicular to the parallel planes of the top piece 32 and bottom piece 34 and that passes through the centers of the top cut-out 40 and bottom cut-out 42. FIG. 2 shows a closer representation of how the reflective strips 20 are arranged relative to the size of top cut-out 40.

During operation, a laser beam is directed through top cut-out 40. In preferred embodiments the size of the top cut-out 40 is less than the size of the laser beam. Typical laser beams are about 2 cm in diameter. The size of bottom cut-out 42 is designed in such a way that the unreflected laser beam passing through the bottom cut-out 42 overlaps with the beams reflected by the polished reflective strips 20 that are supported by the top piece 32 and bottom piece 34. The unreflected laser beam and reflected beams can then be directed onto a photosensitive material and a substrate.

Figure 3:
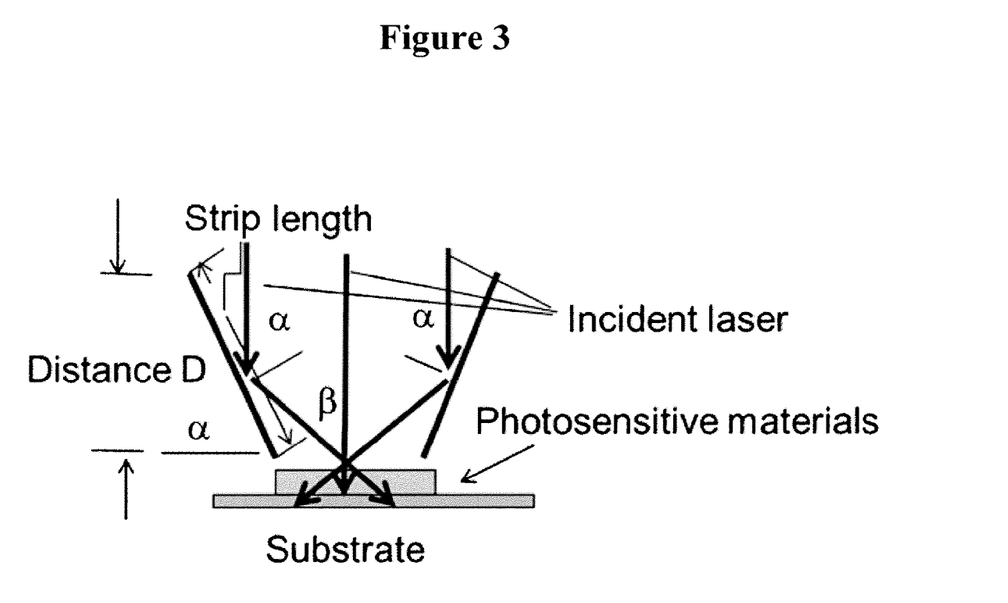
FIG. 3 shows a schematic illustrating the various angles and distances between the incident and reflected laser beams, the reflective strips, and the substrate.

FIG. 3 shows the relationship between the angles of the laser beams and the polished reflective strips 20. The polished reflective strips 20 are tilted in such a way that the relation between the incident angle $\alpha$ onto reflective strips 20 and the refractive index n of the strip material meets the requirement of Brewster's law of n=tan ($\alpha$). In other words, the polished reflective strip 20 is tilted away from the incident laser beam by an angle of 90–$\alpha$. Interfering angle $\beta$ between the side beams reflected off the polished reflective strips 20 and the central beam is related to the incoming beam which is incident onto the reflective strips 20 at an angle of $\alpha$, by the equation of $\beta$=180–2$\alpha$. The distance D between the bottom piece 34 and top piece 32 is related to the length L of the polished reflective strips 20 by D=L sin $\alpha$.

In one example, a 532 nm laser beam was used with silicon reflective strips. The refractive index n of the silicon at 532 nm is 4.15. The incident angle $\alpha$ to all silicon surfaces was close to 77 degrees. Any polished reflective surface made of dielectric materials can replace the silicon strip for the same purpose. The reflective surface needs to be tilted at the critical angle which can be calculated from Brewster's law.

In the preferred embodiments, the silicon-based single reflective optical element is comprised of strips of silicon affixed to the inside of a 3D-printed plastic structure. The strips are cut from a polished silicon wafer to a size of approximately 5 mm wide by 20-27 mm long. The plastic structure is comprised of 7 individual plastic pieces, each designed using commercially available Solidworks 3D CAD software (Dassault Systemes SolidWorks Corp., Waltham, Mass.), and printed on an Up! 3D printer (x object Inc., Brooklyn, N.Y.) using acrylonitrile butadiene styrene (ABS) plastic. The bottom piece is a square plate 5 mm thick with 50 mm side lengths and a geometrically shaped cut-out in the center. Each face of the geometric cutout is sloped and projected inward so it can act as the base to which the silicon strips are affixed. The top piece of the reflective optical element is similar to the bottom piece; the only difference is the size of the geometric hole and the angle of the sloped projections. The bottom and top pieces are separated by four square pillar supports.

In this embodiment, all plastic pieces are held together by extruded and/or intruded plastic notches that interlock to one another, similar to children's interlocking blocks. The cut silicon strips are affixed to the sloped projections on the top and bottom pieces with a slow curing adhesive, and with the reflective side facing up. The height of the pillars, the size of the geometric cut-outs in the top and bottom pieces, and the angle of the sloped projections in the cut-outs of the top and bottom pieces determines the length of the silicon pieces. A final plastic piece of similar dimensions to the top and bottom pieces is attached to the top piece. This piece has 5 mm by 5 mm apertures cut into it that are geometrically spaced throughout so that when interlocked with the top piece it serves as a mask to allow incoming light only on the silicon wafers below it and if desired in the center to allow the incident beam to pass through unaffected.

In order to use the reflective optical element (ROE), it is placed in the path of an expanded and collimated laser beam. Quarter-wave plates can be used to change the polarization of the oncoming beam to circular polarization prior to incidence on the ROE. The ROE is oriented such that the top and bottom pieces are perpendicular to the incident laser beam. The mask on top of the ROE blocks all incoming laser light, except the areas immediately over the reflective strips (and possibly the center, depending on whether the central beam is desired), which generates n or n+1 number of beams based on the n number of strips. Also, given an incident beam's polarization, only a certain amount of p- or s-polarization will be reflected from the strips. The beams generated from the strips are directed to a space behind (below) the ROE, where they form an interference region. It is in this interference region that a photosensitive material can be placed to create photonic crystals or photonic crystal templates using the ROE.

The size and geometry of the ROE is chosen for the optical setup preferred by the user. The size of the ROE is limited only by the incident beam diameter. The angle of the reflective strips with respect to the optical axis is only limited by the size of the ROE. The number of beams (and number of reflective strips) and the interference angle can be changed by simply fabricating another structure. The polarization and intensity of the generated outgoing beams is, however, dependent upon the angle of the strips with respect to the optical axis. This relationship is defined by Fresnel's equations. The use of silicon is not a necessity, but may be preferred due to the well-known properties of silicon and the low cost of silicon wafers. The use of plastic as the material for the body structure of the ROE is also based on the decision to use inexpensive materials, and as such, is not a necessity in the design. Symmetry in the ROE is excellent for generating the multiple beams needed for creating uniform photonic crystals and photonic crystal templates; however, it is not a necessity. An asymmetrically configured ROE can also generate multiple beams in exotic configurations.

Figure 4:
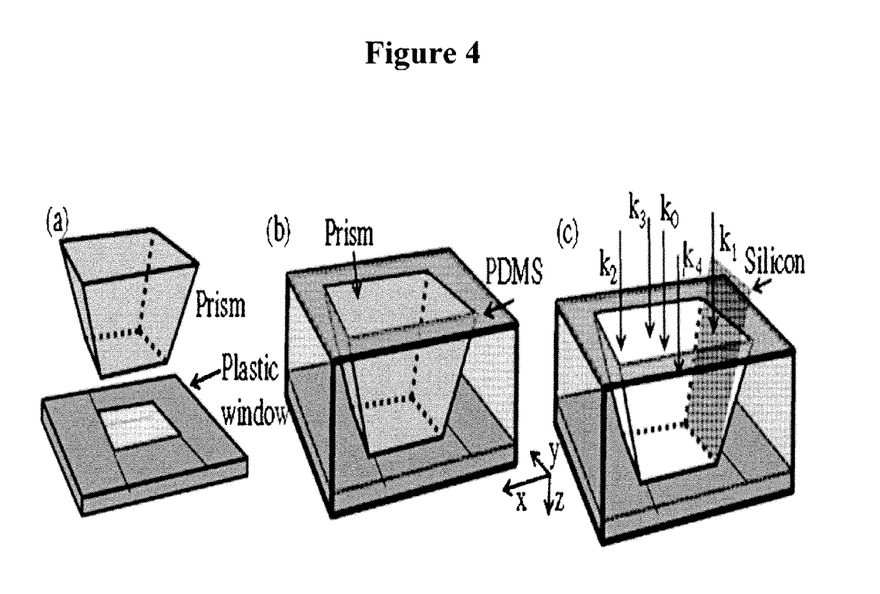
FIG. 4 shows an exemplary scheme for fabrication of the exemplary embodiment of the single reflective optical element, including (a) a flat-top prism supported by plastic base, (b) a polydimethylsiloxane (PDMS) mold formed surrounding the prism, and (c) a silicon chip placed on the inner surface of the PDMS mold after removal of the prism.

The single reflective optical element can be used in interference lithography. In one exemplary embodiment, a single integrated, reflective optical element consisting of four orthogonally oriented silicon facets supported by a polydimethylsiloxane (PDMS) frame was fabricated. The 3D woodpile photonic crystals in a photoresist were fabricated through interference lithography using such a reflective optical element. FIGS. 4(a), 4(b), and 4(c) show various schemes within an exemplary fabrication of a single reflective optical element. FIG. 4(a) shows a flat-top prism that is supported by a plastic base; FIG. 4(b) shows how a PDMS polymer mold is formed surrounding the prism; and FIG. 4(c) shows how the prism is removed and silicon chip is placed on the inner surface of the PDMS mold.

Details of the fabrication method of the exemplary embodiment are as follows: FIG. 4(a) shows a prism sitting on a plastic base for a mold transfer as shown in FIG. 4(a), both of which were located inside a container. A pre-polymer solution of PDMS (Dow Corning Sylgard® 184, Midland, Mich.) was prepared by mixing 4.56 g of curing agent with 45.5 g Sylgard polymer. The pre-solution was poured into container. After the bubbles were blown away, the pre-polymer was cured on a hot-plate at 130° C. for 90 minutes as shown in FIG. 4(b). The prism was then removed and silicon chip was placed on the inner surface of the PDMS mold with polished sides to reflect the laser beam as shown in FIG. 4(c). A single laser beam can be separated into five beams by such single optical element with four side beams arranged symmetrically around the central beam. The incident angle of laser beams on the silicon surface is 78 degrees. For the laser beam 514.5 nm, the silicon refractive index is 4.225. The amplitude reflection coefficients are −0.05 and −0.9 from beams with polarizations parallel with (p-polarized) and normal to (s-polarized) the incident plane, respectively. The reflectance is 0.25% and 81% for the p-polarized and s-polarized beams, respectively. If the incident beam is circularly polarized, the theoretical reflectance is thus 40.6%. 99.7% of the reflected beam is s-polarized when the circularly polarized beam is incident onto the silicon, and the intensity of the p-polarized beam can be ignored. In this experimental setup, the linearly polarized laser passed through a λ/4 wave plate. After the wave-plate, the laser beam was elliptically polarized with an ellipticity of 1.28. A temperature-insensitive wave plate could improve the setup and produce a perfect circularly polarized laser beam. As shown in FIG. 4(c) for the incident laser beam $k_0$ propagating in z direction with the original polarization in x direction and passing the wave-plate, the measured reflectance is 35.6%, 35.6%, 44.9%, and 44.9% for beams $k_1$, $k_2$, $k_3$, and $k_4$, respectively.

Figure 5:
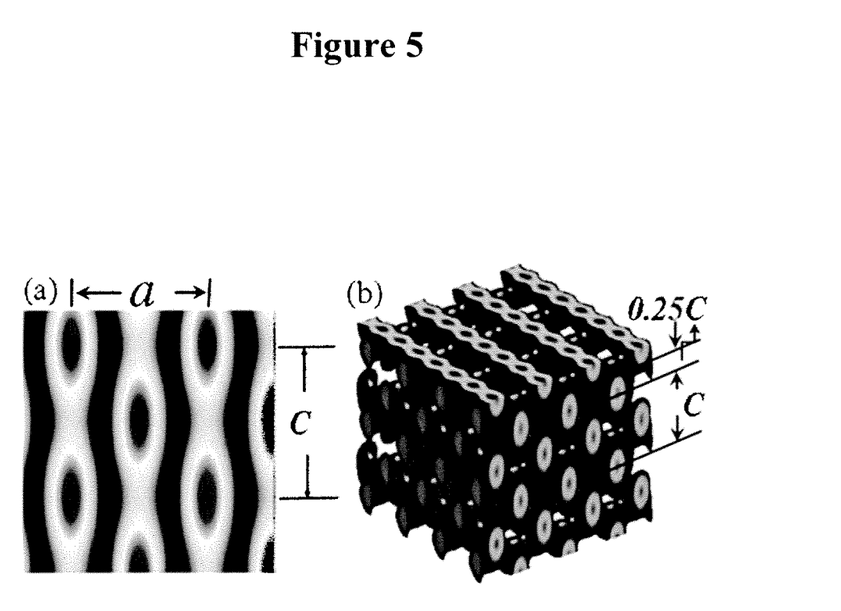
FIG. 5 shows computer simulations of the holographically generated PhCs which include: (a) a three beam interference pattern and (b) a five-beam interference pattern.

FIG. 5(a) shows a computer generated three beam interference pattern, to clearly show the relative size of lattice constants of the PhC generated by a five beam interference pattern and shown in FIG. 5(b). The five-beam interference pattern in FIG. 5(b) can be treated as two parallel three beam interferences where one is shifted by 0.25c due to the phase delay in the center beam.

After passing through the single reflective optical element, the formed four side beams and one central beam can be written as (assuming a same initial phase for all side beams):

$$E_0(r,t)=E_{0x}\cos((k_0 \cdot r-\omega t)+E_{0y}\cos((k_0 \cdot r-\omega t+\pi/2), \quad (1)$$

$$E_1(r,t)=E_{1y}\cos((k_1 \cdot r-\omega t+\delta), \quad (2)$$

$$E_2(r,t)=E_{2y}\cos((k_2 \cdot r-\omega t+\delta), \quad (3)$$

$$E_3(r,t)=E_{3x}\cos((k_3 \cdot r-\omega t+\delta), \quad (4)$$

$$E_4(r,t)=E_{4x}\cos((k_4 \cdot r-\omega t+\delta), \quad (5)$$

where k and ω are the wave vector and angular frequency of the beam, respectively, E is the constant of electric field strength, and δ is the initial phase of the beam. Wave vectors of these five beams can be written as $\{k_0, k_1, k_2, k_3, k_4\}=2\pi/\lambda\{[0, 0, 1], [\sin\theta, 0, \cos\theta], [-\sin\theta, 0, \cos\theta], [0, -\sin\theta, \cos\theta], [0, \sin\theta, \cos\theta]\}$, where λ is the wavelength of the laser (λ=514.5 nm) and θ is the angle between four side beams and central beam.

When the five beams overlap, an interference pattern be form determined by the following equation:

$$I(r) = I_0 + \Delta I(r) = <\sum_{i=1}^{5} E_i^2(r,t)> \\ + \sum_{i<j}^{5} E_i \cdot E_j \cos[(k_i-k_j)\cdot r + (\delta_i - \delta_j)] \quad (6)$$

Due to the orthogonal polarization between beams ($k_1$, $k_2$) and beams ($k_3$, $k_4$), this five-beam interference can be treated as two parallel three-beam interferences. Two sequential overlaps of three-beam interference have been experimentally demonstrated for woodpile-type 3D structures. The interference part of Eq. (6) can be written as sum of two terms:

$$\sum_{i<j}^{3} E_{ix} \cdot E_{jx} \cos[(k_i-k_j)\cdot r + \delta] \quad (7)$$

$$\sum_{p<q}^{3} E_{py} \cdot E_{qy} \cos\left[(k_p-k_q)\cdot r + \frac{\pi}{2} + \delta\right] \quad (8)$$

Each term can have an interference pattern as shown in FIG. 5(a) but the orientation is rotated by 90 degrees. Furthermore, the phase in Eq. (8) can be written as:

$$(k_p - k_q) \cdot r + \frac{\pi}{2} + \delta = (k_p - k_q) \cdot (r + r_d) + \delta$$

where $(k_p - k_q) \cdot r_d = \pi/2$.

Thus $r_d$=(0.25 a, 0, 0.25c) is the shift of interference (among beams $k_0$, $k_1$ and $k_3$) due to the phase delay, where a and c are the lattice constants in x (or y) and z directions, respectively. The interference pattern due to two parallel three-beam interferences is shown in FIG. 5(b). The shift of pattern in one direction relative to the other is clearly observed and the formed pattern is a woodpile-type structure.

Holographic fabrication of 3D photonic structures using the single reflective optical element is also possible. In one example, an Ar ion laser beam (514.5 nm, Coherent Inc., Santa Clara, Calif.) was passed through a quarter wave plate and spatial filter, expanded and collimated to a size of 2 inches. The photoresist was a mixture of the following components in the specified weight concentrations: dipentaerythritol penta/hexaacrylate (DPHPA) monomer (Sigma-Aldrich, St. Louis, Mo., 90.36%), a photo initiator rose bengal (0.16%), co-initiator N-phenyl glycine (NPG, 0.67%), and chain extender N-vinyl pyrrolidinone (NVP, 8.81%). The mixture was spin-coated on a glass slide with a speed of 600 rpm for 30 seconds. The photoresist film was exposed to the interference pattern formed through a single beam and the single reflective optical element. The laser power was 200 mW and a typical exposure was 1.2 seconds. In a mixture batch where the weight concentration of Rose Bengal was reduced by a half, a power of 260 mW was then used. The exposed sample was developed in propylene glycol monomethyl ether acetate (PGMEA) for 3 minutes, rinsed by isopropanol for one minute and left to dry in air.

Figure 6:
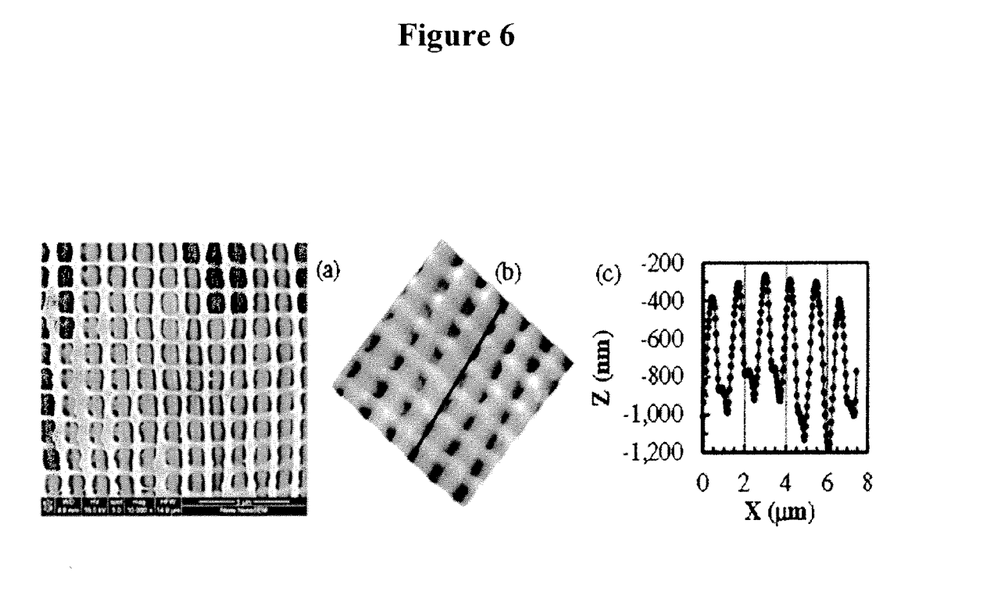
FIG. 6 shows (a) a scanning electron microscope (SEM) image of a holographically formed 3D photonic crystal template in dipentaerythritol penta/hexaacrylate (DPHPA), (b) an atomic force microscope (AFM) image of the photonic crystal template in DPHPA, and (c) a surface profile measured along the line shown in the AFM image.

FIG. 6(a) shows a scanning electron microscope (SEM) image of the holographically formed 3D photonic crystal template in DPHPA. The SEM image shows a wood-pile like structure and looks similar to the simulated interference pattern in FIG. 5. Based on the scale bar on the SEM, the lattice period in x (or) direction is measured to 1.239 microns. FIG. 6(b) shows an atomic force microscope (AFM) image of the 3D photonic crystal template in DPI-IPA. A surface profile along the line in the AFM is shown in FIG. 6(c) and the lattice period in x-direction is measured to be 1.232 microns. The lattice constant in x(or y)-direction is 1.248 microns based on a theoretical calculation for the incident angle of 78 degrees. The agreement between measured and theoretical values is very good.

The above multi-beam interference with 78 degree incident angle can only generate tetragonal photonic crystals. In order to improve the crystal symmetry thus increase the photonic bandgap size, the incident angle needs to be changed. For the incident angle of 54.7 degrees, the interfering angle between side beam and central beam is 70.5 degree thus a face-centered cubic crystal can be generated. When the incident angle is decreased from 78 to 54.7 degree, the reflectance for p-polarized beam is increased from 0.25% to 18% and for s-polarized beam the reflectance is decreased from 81% to 60%. However the interference patterns are still dominated by the interference between the central, circularly-polarized beam and the side, s-polarized beam.

Figure 7:
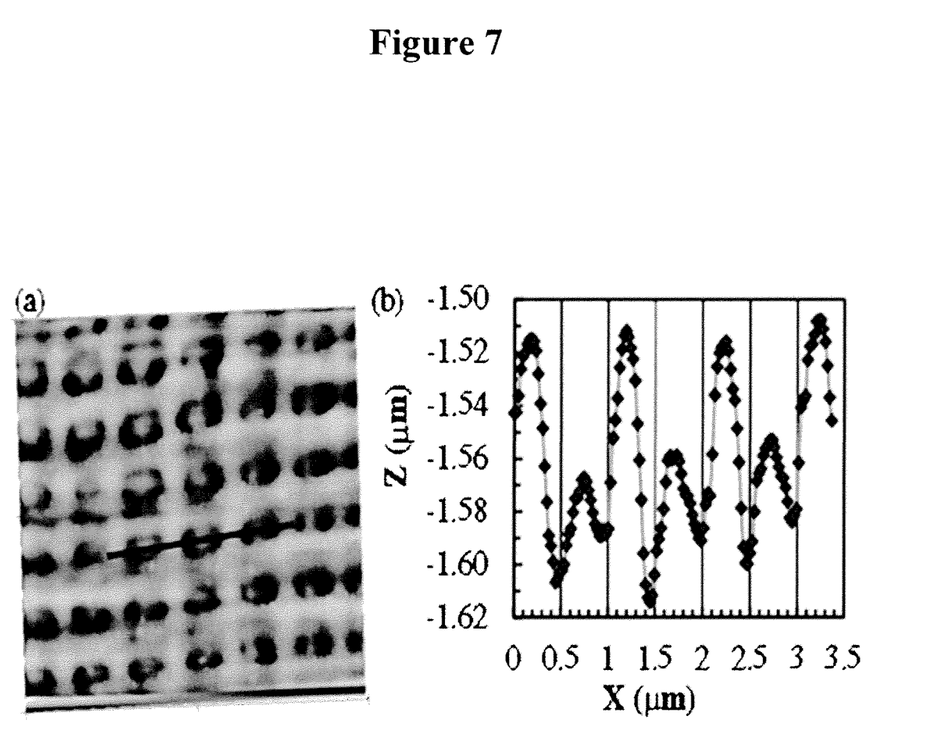
FIG. 7 shows (a) an AFM image of the photonic crystal template in DPHPA and (b) a surface profile measured along the line in the AFM image.

To demonstrate the incident angle reconfiguration, a piece of glass slide with a thickness of 1 mm under the silicon chip was added on the bottom edge of the PDMS mold in FIG. 4(c). The incident angle was thus changed from 78 to 74.9 degrees. The new optical element was used for the holographic fabrication of 3D photonic crystal templates. FIG. 7(a) shows AFM image of 3D photonic crystal template fabricated in DPHPA with a similar experimental condition. A surface profile is shown in FIG. 7(b) for the lined section in the AFM image. Woodpile-like structures are clearly visible. The lattice period in x-direction was measured to be 1.023 micron from the surface profile, in good agreement with the theoretical value of 1.024 microns.

Using the current single reflective optical element, all five beams have the same intensity assuming the incident beam is uniform and the measured ratio of the central beam intensity over the side beam intensity is around 2.5. The intensity contrast in the interference pattern is improved compared to other methods of holographic lithography. The improved intensity contrast can help remove un-polymerized monomers out of the 3D polymerized interconnected structures during the development process.

REFERENCES

The following references, to the extent that they provide exemplary procedural or other details supplementary to those set forth herein, are specifically incorporated herein by reference.

Non-Patent Publications

J. D. Joannopoulos, R. D. Meade and J. N. Winn, "*Photonic crystals*," (Princeton, 1995).

S. Noda, M. Yokoyama, M. Imada, A. Chutinan, and M. Mochizuki, "Polarization mode control of two-dimensional photonic crystal laser by unit cell structure design," Science 293, 1123-1125 (2001).

K. P. Chen, B. McMillan, and L. Cashdollar, "Self-heated fiber Bragg grating sensors", Appl. Phys. Lett., 86, 143503 (2005).

Ye Liu, Fei Qin, Zi-Ming Meng, Fei Zhou, Qing-He Mao, and Zhi-Yuan Li, "All-optical logic gates based on two-dimensional low-refractive-index nonlinear photonic crystal slabs," Opt. Express 19, 1945-1953 (2011), http://www.opticsinfobase.org/oe/abstract.cfm?URI=oe-19-3-1945

Aniwat Tandaechanurat, Satomi Ishida, Denis Guimard, Masahiro Nomura, Satoshi Iwamoto and Yasuhiko Arakawa, "Lasing oscillation in a three-dimensional photonic crystal nanocavity with a complete bandgap," Nat. Photonics 5, 91-94 (2011).

K. M. Ho, C. T. Chan, C. M. Soukoulis, R. Biswas, and M. Sigalas, "Photonic band gaps in three dimensions: new layer-by-layer periodic structures," Solid State Commun. 89, 413-416 (1994).

A. Blanco. E. Chomski, S. Grabtchak, M. Ibisate, S. John, S. W. Leonard, C. Lopez, F. Meseguer, H. Miguez, J. P. Mondia, G. A. Ozin, O. Toader, A. Geoffrey, O. Toader, H. M. van Driel, "Large-scale synthesis of a silicon photonic crystal with a complete three-dimensional bandgap near 1.5 micrometers," Nature 405, 437 140 (2000).

M. Deubel, G. von Freymann, M. Wegener, S. Pereira, K. Busch, and C. M. Soukoulis, "Direct laser writing of three-dimensional photonic-crystal templates for telecommunications," Nat. Mater. 3, 444-447 (2004).

M. Campbell, D. N. Sharp, M. T. Harrison, R. G. Denning, and A. J. Turberfield, "Fabrication of photonic crystals for the visible spectrum by holographic lithography", Nature 404, 53-56 (2000).

S. Yang, M. Megens, J. Aizenberg, P. Wiltzius, P. M. Chaikin, and W. B. Russel, "Creating periodic three-dimensional structures by multibeam interference of visible laser," Chem. Mater. 14, 2831-2833 (2002).

Y. Lin, P. R. Herman, and K. Darmawikarta, "Design and holographic fabrication of tetragonal and cubic photonic crystals with phase mask: toward the mass-production of three-dimensional photonic crystals," Appl. Phys. Lett. 86, 071117 (2005).

Y. Lin, A. Harb, D. Rodriguez, K. Lozano, D. Xu, and K. P. Chen, "Fabrication of two-layer integrated phase mask for single-beam and single-exposure fabrication of three-dimensional photonic crystal," Opt. Express 16, 9165-9172 (2008), http://www.opticsexpress.org/abstract.cfm?URI=OPEX-16-12-9165.

D. Chanda, L. E. Abolghasemi, M. Haque, M. L. Ng, and P. R. Herman, "Multi-level diffractive optics for single laser exposure fabrication of telecom-band diamond-like 3-dimensional photonic crystals," Opt. Express 16, 15402-15414 (2008), http://www.opticsexpress.org/abstract.cfm?URI=OPEX-16-20-15402.

Kris Ohlinger, Hualiang Zhang, Yuankun Lin, Di Xu, and Kevin P. Chen, "A tunable three layer phase mask for single laser exposure 3D photonic crystal generations: bandgap simulation and holographic fabrication," Opt. Mater. Express 1, 1034-1039 (2011), http://www.opticsinfobase.org/ome/abstract.cfm?URI=ome-1-5-1034.

Y. K. Pang, J. C. Lee, C. T. Ho, and W. Y. Tam, "Realization of woodpile structure using optical interference holography," Opt. Express 14, 9113-9119 (2006), http://www.opticsinfobase.org/oe/abstract.cfm?URI=oe-14-20-911.

D. Xu, K. P. Chen, A. Harb, D. Rodriguez, K. Lozano and Y. Lin, "Phase tunable holographic fabrication for three-dimensional photonic crystal templates by using a single optical element", Appl. Phys. Lett. 94, 231116 (2009).

S.-G. Park, M. Miyake, S.-M. Yang and P. V. Braun, "Cu$_2$O Inverse Woodpile Photonic Crystals by Prism Holographic Lithography and Electrodeposition," Advanced Materials 23, 2749-2752 (2011).

T. Y. M. Chan, O. Toader, and S. John, "Photonic band-gap formation by optical-phase-mask lithography," Phys. Rev. E 73, 046610 (2006).

O. Toader, T. Y. M. Chan, and S. John, "Diamond photonic band gap synthesis by umbrella holographic lithography," Appl. Phys. Lett. 89, 101117 (2006).

David F. Edwards, "Silicon (Si)," in *Handbook of Optical Constants of Solids*, E. D. Palik, ed. (Academic, Orlando, Fla., 1985).

What is claimed is:

1. A single reflective optical element for use in polarization of a laser beam, comprising:
    a support having a cut-out to allow passage of a circularly polarized laser beam; and
    at least two strips having a reflective surface arranged in the cut-out,
    wherein the strips are tilted at a critical angle relative to the circularly polarized laser beam and the reflective surface faces the circularly polarized laser beam, and wherein the strips are positioned so that when the circularly polarized laser beam passes through the cut-out, portions of the circularly polarized laser beam are reflected to generate linearly polarized beams that overlap with the circularly polarized laser beam and form an interference pattern where the circularly polarized laser beam passes out of the support,
    wherein the interference pattern creates photonic crystals or photonic crystal templates in a photosensitive material.

2. The single reflective optical element of claim 1, wherein the strips are made of silicon.

3. The single reflective optical element of claim 1, wherein four strips are arranged in the cut-out.

4. The single reflective optical element of claim 1, wherein the support comprises a top piece, a bottom piece, and support separators to separate the top piece and the bottom piece.

5. The single reflective optical element of claim 4, wherein the top piece comprises a top cut-out, the bottom piece comprises a bottom cut-out, and the strips are arranged between the top cut-out and the bottom cut-out.

6. The single reflective optical element of claim 5, wherein the top piece and the bottom piece are parallel, wherein the top cut-out and the bottom cut-out have rotational symmetry along an axis that is perpendicular to the top piece and the bottom piece and that passes through centers of the top cut-out and the bottom cut-out, and wherein the strips are arranged symmetrically around the axis.

7. The single reflective optical element of claim 1, wherein the cut-out is smaller than the diameter of the circularly polarized laser beam.

8. The single reflective optical element of claim 1, wherein the support comprises a solid plastic piece molded to have the cut-out with sides tilted at the critical angle and wherein the strips are placed on surfaces of the sides of the cut-out.

9. The single reflective optical element of claim 1, wherein the strips are tilted so that a relation between an incident angle α of the circularly polarized laser beam on the strips and a refractive index n of the strips meets Brewster's law of n=tan (α) and the strips are tilted away from the circularly polarized laser beam by the critical angle of 90−α.

10. The single reflective optical element of claim 9, wherein the support comprises a top piece, a bottom piece, and support separators to separate the top piece and the bottom piece, wherein the strips extend along a length L from the top piece to the bottom piece, and wherein the length L of the strips is related to a distance D between the top piece and the bottom piece by D=L sin α.

11. A method of using a single reflective optical element to create photonic crystals or photonic crystal templates, comprising:
    placing a single reflective optical element in a path of a circularly polarized laser beam, wherein the single reflective optical element comprises a support having a cut-out to allow passage of the circularly polarized laser beam and at least two strips having a reflective surface arranged in the cut-out, and wherein the strips are tilted at a critical angle relative to the circularly polarized laser beam and the reflective surface faces the circularly polarized laser beam;
    passing the circularly polarized laser beam through the cut-out of the single reflective optical element, whereby portions of the circularly polarized laser beam are reflected by the strips to generate linearly polarized beams that overlap with the circularly polarized laser beam and form an interference pattern where the circularly polarized laser beam passes out of the support; and
    directing the linearly polarized beams and the circularly polarized laser beam onto a photosensitive material to create photonic crystals or photonic crystal templates using the interference pattern.

12. The method of claim 11, wherein the circularly polarized laser beam is expanded and collimated before passing through the single reflective optical element.

13. The method of claim 11, wherein the strips are made of silicon.

14. The single method of claim 11, wherein four strips are arranged in the cut-out.

15. The method of claim 11, wherein the support comprises a top piece, a bottom piece, and support separators to separate the top piece and the bottom piece.

16. The method of claim 15, wherein the top piece comprises a top cut-out, the bottom piece comprises a bottom cut-out, and the strips are arranged between the top cut-out and the bottom cut-out.

17. The method of claim 16, wherein the top piece and the bottom piece are parallel and wherein the circularly polarized laser beam is perpendicular to the top piece and the bottom piece.

18. The method of claim 17, wherein the top cut-out and the bottom cut-out have rotational symmetry along an axis of the circularly polarized laser beam that passes through centers of the top cut-out and the bottom cut-out, and wherein the strips are arranged symmetrically around the axis.

19. The method of claim 11, wherein the cut-out is smaller than the diameter of the circularly polarized laser beam.

20. The method of claim 11, wherein the support comprises a solid plastic piece molded to have the cut-out with sides tilted at the critical angle and wherein the strips are placed on surfaces of the sides of the cut-out.

21. The method of claim 11, wherein the strips are tilted so that a relation between an incident angle $\alpha$ of the circularly polarized laser beam on the strips and a refractive index n of the strips meets Brewster's law of $n=\tan(\alpha)$ and the strips are tilted away from the circularly polarized laser beam by the critical angle of $90-\alpha$.

22. The method of claim 21, wherein the support comprises a top piece, a bottom piece, and support separators to separate the top piece and the bottom piece, wherein the strips extend along a length L from the top piece to the bottom piece, and wherein the length L of the strips is related to a distance D between the top piece and the bottom piece by $D=L \sin \alpha$.

23. The method of claim 11, further comprising the step of placing a mask on the single reflective optical element to block at least a portion of the circularly polarized laser beam from passing though the cut-out.

\* \* \* \* \*